(12) United States Patent
Toth et al.

(10) Patent No.: US 7,247,849 B1
(45) Date of Patent: Jul. 24, 2007

(54) AUTOMATED FOCUSING OF ELECTRON IMAGE

(75) Inventors: Gabor D. Toth, San Jose, CA (US); Varoujan Chakarian, Fremont, CA (US); Douglas K. Masnaghetti, San Jose, CA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 0 days.

(21) Appl. No.: 11/366,306

(22) Filed: Mar. 1, 2006

Related U.S. Application Data

(62) Division of application No. 10/700,144, filed on Nov. 3, 2003, now Pat. No. 7,041,976.

(51) Int. Cl.
*H01J 49/00* (2006.01)
(52) U.S. Cl. ............................. 250/307; 250/310
(58) Field of Classification Search ............... None
See application file for complete search history.

(56) References Cited

U.S. PATENT DOCUMENTS

| | | | |
|---|---|---|---|
| 5,387,793 A * | 2/1995 | Sato et al. ............... 250/310 |
| 5,404,012 A * | 4/1995 | Yamada ................... 250/310 |
| 5,408,098 A * | 4/1995 | Wells ...................... 250/310 |
| 6,232,787 B1 * | 5/2001 | Lo et al. .................. 324/751 |
| 6,548,810 B2 * | 4/2003 | Zaluzec .................. 250/306 |
| 6,566,897 B2 * | 5/2003 | Lo et al. .................. 324/751 |
| 6,683,320 B2 * | 1/2004 | Gerlach et al. ......... 250/494.1 |
| 7,030,375 B1 * | 4/2006 | Testoni et al. .......... 250/305 |

* cited by examiner

*Primary Examiner*—David A. Vanore
(74) *Attorney, Agent, or Firm*—Okamoto & Benedicto LLP

(57) ABSTRACT

One embodiment disclosed relates to a method for automated focusing of an electron image. An EF cut-off voltage is determined. In compensation for a change in the EF cut-off voltage, a focusing condition is adjusted. Adjusting the focusing condition may comprise, for example, adjusting a wafer bias voltage in correspondence to the change in cut-off voltage. Another embodiment disclosed relates to a method for automated focusing of an electron image in a scanning electron imaging apparatus. A focusing condition of a primary electron beam in a first image plane is varied so as to maximize an intensity of a secondary electron beam through an aperture in a second image plane.

7 Claims, 11 Drawing Sheets

AUTOMATED FOCUSING OF ELECTRON IMAGE

CROSS-REFERENCE TO RELATED APPLICATION(S)

The present application is a divisional application of U.S. patent application Ser. No. 10/700,144 now U.S. Pat. No. 7,041,976, entitled "Automated Focusing of Electron Image," filed Nov. 3, 2003. The disclosure of U.S. patent application Ser. No. 10/700,144 is hereby incorporated by reference.

BACKGROUND OF THE INVENTION

1. Field of the Invention

The present invention relates generally to specimen inspection and review. More particularly, the present invention relates to electron beam inspection and review systems.

2. Description of the Background Art

Automated inspection and review systems are important in process control and yield management for the semiconductor and related microelectronics industries. Such systems include electron beam (e-beam) based systems.

FIG. 1 is a simplified schematic representation of a conventional electron column and collection system for electron beam inspection. In brief, FIG. 1 shows a schematic diagram of the various electron beam paths within the column. Electrons are emitted radially from field emission cathode 81 and appear to originate from a very small bright point source. Under the combined action of the accelerating field and condenser lens magnetic field, the beam is collimated into a parallel beam. Gun anode aperture 87 masks off electrons emitted at unusable angles, while the remaining beam continues on to beam limiting aperture 99. An upper deflector (not depicted) is used for stigmation and alignment, ensuring that the final beam is round and that it passes through the objective lens (not depicted). A condenser lens (not depicted) is mechanically centered to the axis defined by cathode 81 and beam limiting aperture 99. The deflection follows the path shown, so that the scanned, focused probe emerges from the objective lens to impact on the substrate 57.

As a result of the impact of the primary beam onto the substrate 57, scattered electrons are generated. The scattered electrons may include secondary electrons and backscattered electrons. Wien filter deflectors 112 deflect the scattered electron beam 120 into the electron detector 117.

SUMMARY

One embodiment of the invention pertains to a method for automated focusing of an electron image. An EF cut-off voltage is determined. In compensation for a change in the EF cut-off voltage, a focusing condition is adjusted. Adjusting the focusing condition may comprise, for example, adjusting a wafer bias voltage in correspondence to the change in cut-off voltage.

Another embodiment of the invention relates to a method for automated focusing of an electron image in a scanning electron imaging apparatus. A focusing condition of a primary electron beam in a first image plane is varied so as to maximize an intensity of a secondary electron beam through an aperture in a second image plane.

DETAILED DESCRIPTION

One aspect of electron imaging regards focusing the image. In particular, it is desirable to be able to focus the image in an automated manner. One aspect of the present invention provides improved methods and apparatus for automated focusing of an electron image.

Figure 1:
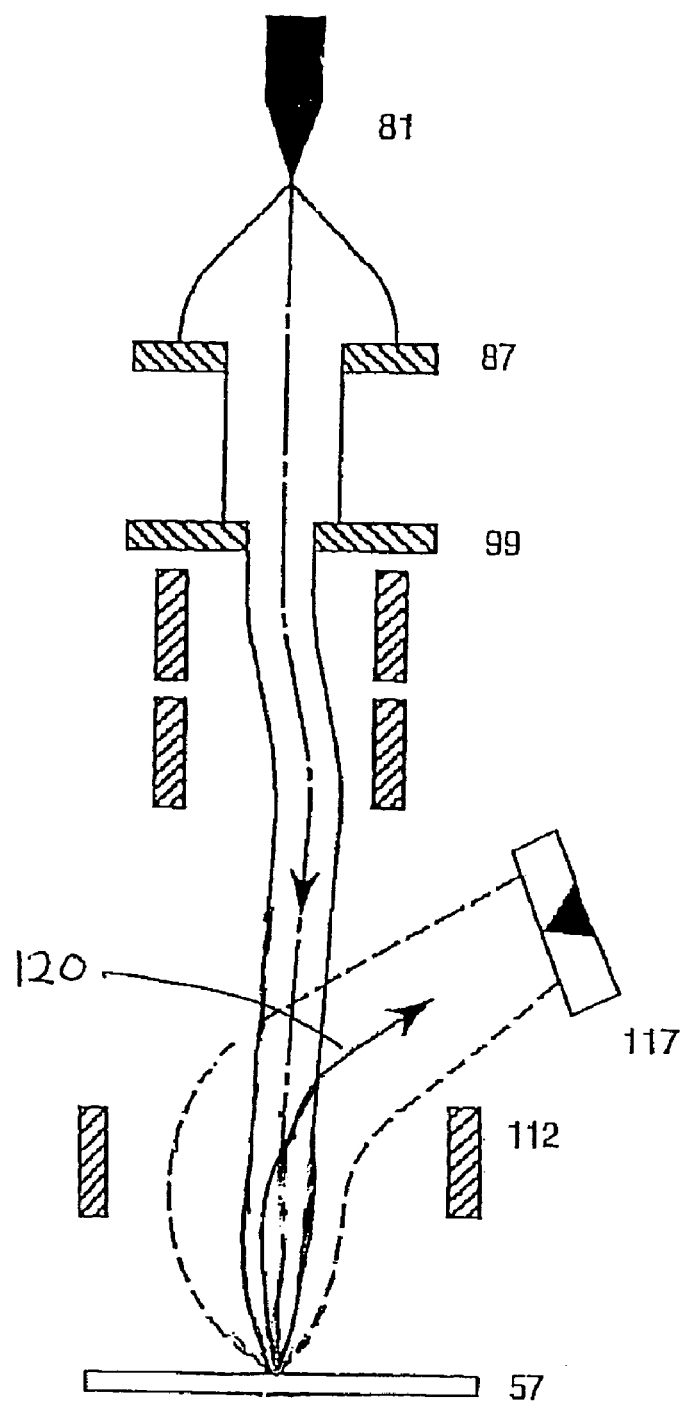
FIG. 1 is a simplified schematic representation of a conventional electron column and collection system for electron beam inspection.
Figure 2:
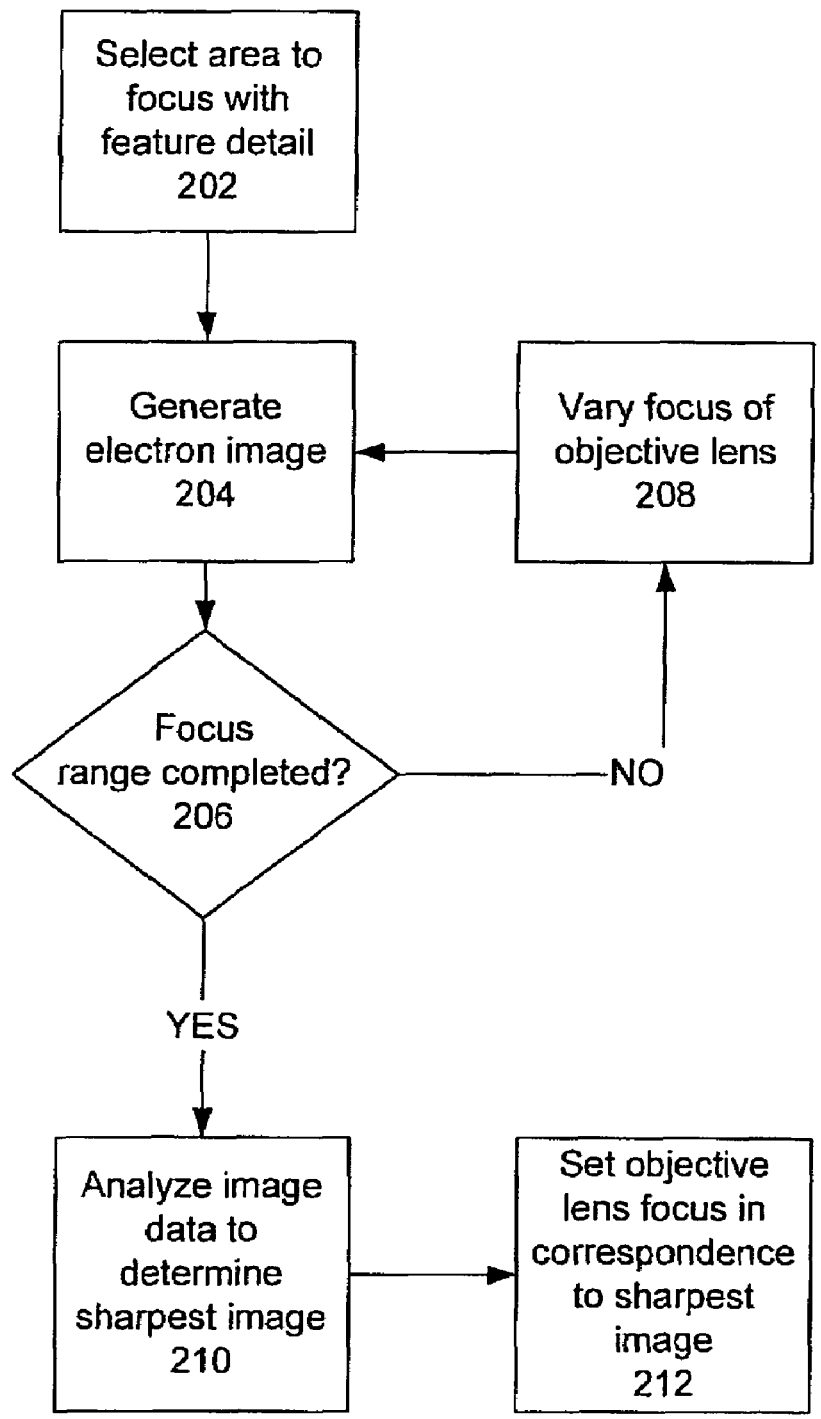
FIG. 2 is a flow chart depicting a conventional method for automated focusing of an electron image.

Automated focusing of an electron image is typically accomplished using a conventional procedure with steps such as those illustrated in FIG. 2. The procedure may be carried out in an electron column similar to that described above in relation to FIG. 1. An area on the specimen to be focus is selected 202. This area should have sufficient feature detail so that the automated focusing procedure can determine when the image is in-focus and when it is out-of-focus.

An electron image of the selected area is generated 204. The image may be generated with the objective lens at an initial focusing condition. Subsequently, the focus of the objective lens may be varied 208 across a range of focuses and electron images generated 204 at each focus level, until the range of focuses is completed 206. The focus may be varied, for example, by changing the current and/or voltage for the objective lens. After the various images have been obtained across the range of focus conditions, then the image data may be analyzed 210 to determine the sharpest, i.e. most in-focus, image. The analysis 210 may be performed by an algorithm, for example, that determines which image has the greatest portion of high spatial frequency components in the image. Once the in-focus image is determined, the focus condition for the objective lens may be set 212 in correspondence to that sharpest image (i.e. so as to reproduce the conditions that created the in-focus image).

The above-described conventional method of automated focusing has certain disadvantages and limitations. First, the selected area on which to perform the auto-focusing has to have sufficiently distinct features such that the images may be analyzed to determine the in-focus condition. This prevents the above-described conventional auto-focusing from being effective on substrate areas without such distinct features for contrast-based focusing.

Second, certain specimens may comprise a low-k (low dielectric constant) dielectric substrate. Such substrates often have substantial variation in surface charge at different locations on the substrate surface. For example, two different points on the surface of the dielectric may have differing surface charge such that there may be a few hundred surface voltage difference between the two points. In that case, the in-focus condition at the two points would not be the same because a change in the surface charge for the area being imaged can cause the image to go out of focus. In other words, the in-focus condition determined by auto-focusing at one of the points would not be valid for the other point. Similarly, the surface charge at a single point may vary substantially over time.

An existing technique to deal with these variations in surface charge for low-k dielectrics involves measuring surface charge at various locations with a Kelvin probe. This is not performed contemporaneously at the focusing site. Rather, the Kelvin probe measurements are performed beforehand at a set of locations, and a map of surface voltages are generated therefrom by way of interpolation. The resulting data may then be used to determine an adjustment of the focus due to surface charge. However, measuring surface charge with a Kelvin probe is cumbersome and typically quite slow. Moreover, the technique using the interpolations are frequently very inaccurate, so the resulting surface charge map is unreliable.

Figure 3:
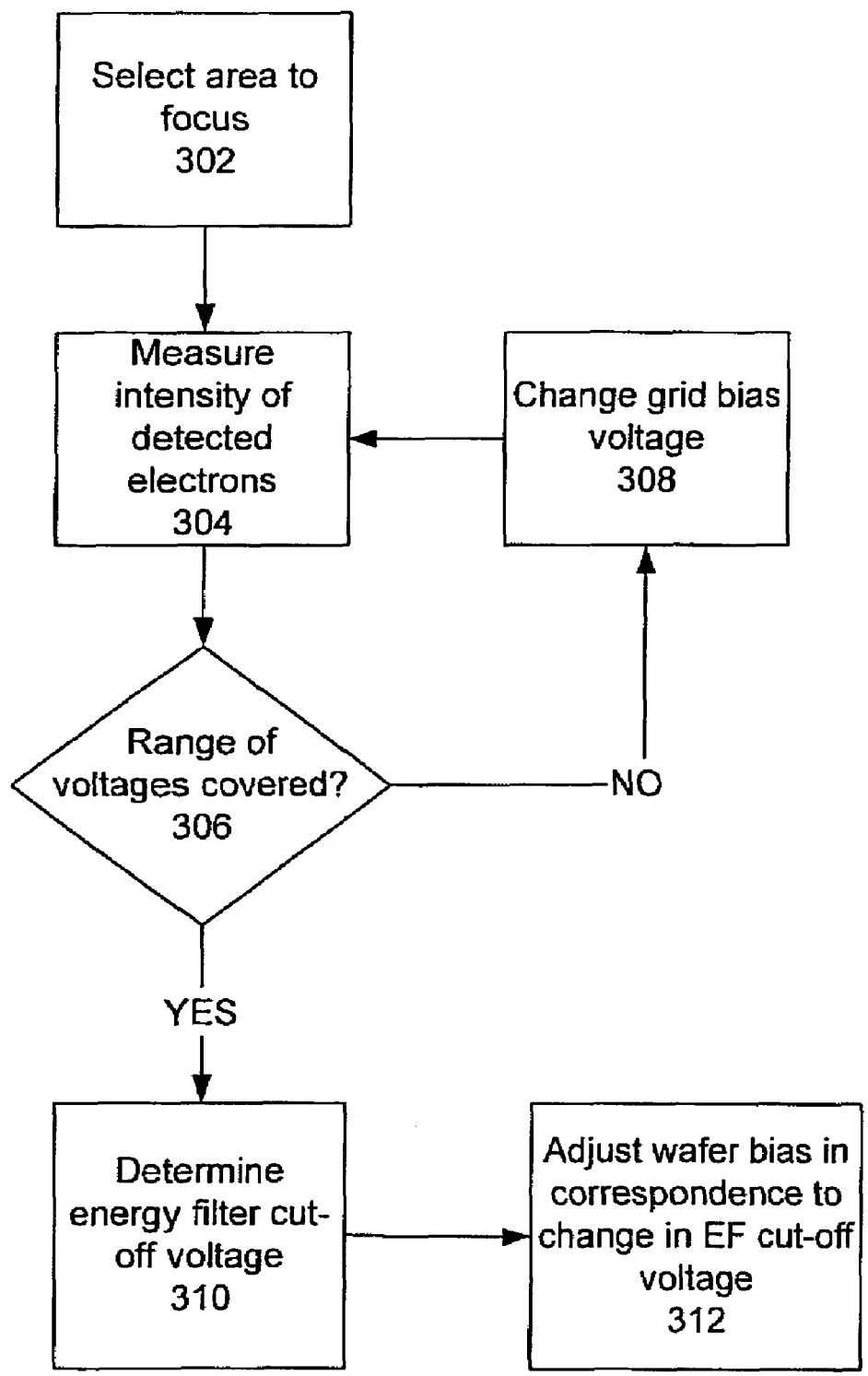
FIG. 3 is a flow chart depicting a method for automated focusing of an electron image in accordance with an embodiment of the invention.

FIG. 3 is a flow chart depicting a method for automated focusing of an electron image in accordance with an embodiment of the invention. An area on the specimen to be focus is selected 302. Advantageously, using this method, the area selected does not require the amount of feature detail required by the conventional auto-focusing procedure. This is because the method does not rely on contrast-based focusing.

The method may be carried out, for example, using a scanning electron imaging apparatus similar to that described above in relation to FIG. 1 and a detection and control system such as that described below in relation to FIG. 4. In an alternate embodiment, the method may be carried out using a projection type (non-scanning) electron imaging apparatus.

An intensity of the scattered electrons that are detected is measured 304. The intensity may be detected with the electron column at an initial focusing condition. Subsequently, a grid bias voltage on an energy filter in the detection system may be varied 308 across a range of voltages and corresponding detected intensities obtained 304 at each grid bias level, until the range of grid bias voltages is completed 306. One embodiment of a detection system with an energy filter for application of the grid bias voltages is depicted in FIG. 4.

Using the various detected intensities obtained across the range of grid bias voltages, an energy filter (EF) cut-off voltage is determined 308. The EF cut-off voltage comprises a voltage level below which secondary electrons are cut-off, leaving only backscattered electrons to be detected. If the grid bias voltage is below (more negative) than the EF cut-off voltage, than the secondary electrons generally do not have sufficient energy to make it past the grid into the detector. The backscattered electrons do still have sufficient energy to make it past the grid to be detected, but the lack of secondary electrons making it past the energy filter grid substantially reduces the detected intensity. On the other hand, if the grid bias voltage is above (less negative) than the EF cut-off voltage, than the secondary electrons generally have sufficient energy to make it past the grid into the detector, so the detected intensity is at a higher level. Around the EF cut-off voltage is where the detected intensity makes a substantial and characteristic drop. The EF cut-off voltage may be determined algorithmically. In one implementation, the algorithm may differentiate the intensity data with respect to applied grid voltage to obtain data reflecting the change in intensity per grid voltage. The EF cut-off voltage may be determined as the grid voltage at which the change in intensity is at a maximum magnitude.

By determining the EF cut-off voltage as describe above, then a wafer bias voltage may be adjusted 312 by an amount in correspondence to a change, if any, in the EF cut-off voltage. The wafer bias voltage (also known as the substrate bias voltage) refers to a controllable voltage applied to the substrate being imaged. The wafer bias voltage comprises a variable component that affects the objective lens focusing. In accordance with an embodiment of the invention, adjusting the wafer bias voltage in this manner results in maintaining focus such that a subsequently obtained electron image is kept in-focus. In other words, the focus of the electron imaging may be maintained by monitoring the EF cut-off voltage and by adjusting the wafer bias voltage in compensation for detected changes in the EF cut-off voltage. In alternate embodiments, instead of adjusting the wafer bias voltage, another focusing condition may be adjusted, such as the objective lens current, the source voltage, or the extraction field strength.

There are various advantages to the EF auto-focusing method. The method may be performed rapidly, and the method does not require a detail feature in the image to focus on. Instead, the method measures and utilizes an average detected intensity and can even focus on a bare wafer without an image pattern. As such, the method advantageously works well under low signal to noise conditions. The method can be performed at very low energy densities (low magnification), leading to much less wafer dosing and less chance for surface damage. Unlike the Kelvin probe technique, there is no need to generate a map based on measuring multiple sites and interpolating therebetween. The inaccuracies of such interpolation are avoided. The method advantageously adapts to local changes in landing energy, thus improving metrology accuracy. Furthermore, the method allows for a large-range auto-focus, whereas the conventional method of contrast-based focusing is typically used with a shorter focus range that may be ineffective on dielectric substrates with large surface voltage variations.

Figure 4:
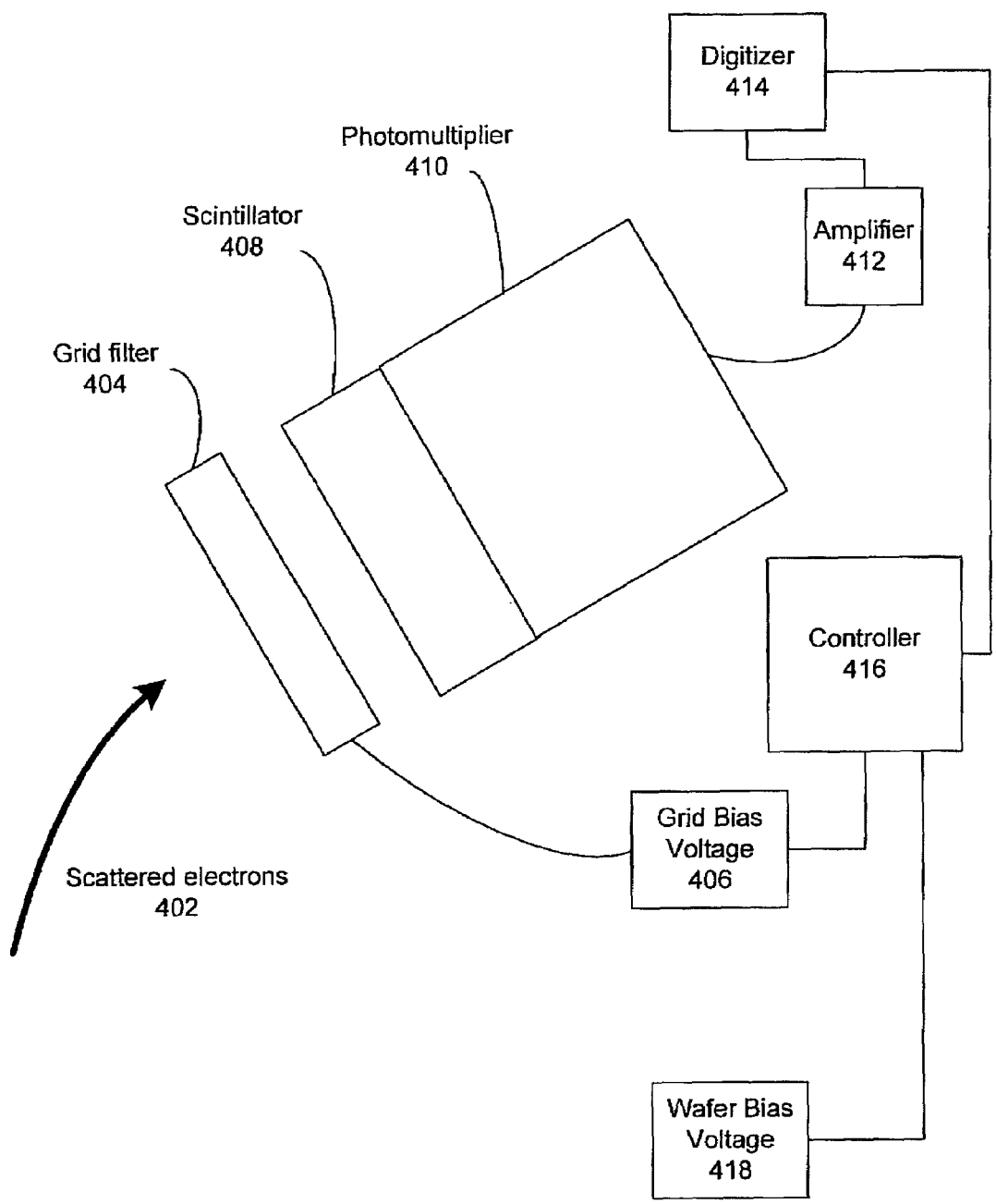
FIG. 4 is a schematic diagram of a detection and control system for automated focusing of an electron image in accordance with an embodiment of the invention.

FIG. 4 is a schematic diagram of a detection and control system for automated focusing of an electron image in accordance with an embodiment of the invention. In one implementation, the detection and control system may be incorporated into a scanning electron beam apparatus such as the one depicted in FIG. 1.

Scattered electrons 402 are received by the detection system. The scattered electrons are electrons generated due to impingement of the primary electron beam onto the specimen. The scattered electrons typically include backscattered electrons and/or secondary electrons.

The scattered electrons 402 reach an energy filter or grid filter 404 at a front-end of the detector. The grid filter 404 is biased with a grid bias voltage 406. As described above in relation to FIG. 3, the grid bias voltage 406 may be varied to determine an EF cut-off voltage.

Those scattered electrons that have sufficient energy to make it past the grid filter 404 impinge upon a scintillator

408. The scintillator 408 functions to convert the detected electrons to a corresponding amount of photons. The photomultiplier 410 in effect converts the photons to an electronic signal. The electronic signal is amplified by an amplifier circuit 412 and digitized by a digitizer circuit 414.

A controller 416 receives the digitized signal and determines a detected intensity therefrom. The controller 416 may also be coupled to control the grid bias voltage 406 and the wafer bias voltage 418. In one embodiment of the invention, the controller 416 may control the grid bias voltage 406 and the wafer bias voltage 418 in accordance with the method described above in relation to FIG. 3. The controller 416 may comprise a microcontroller with software configured to perform the above functions.

Figure 5:
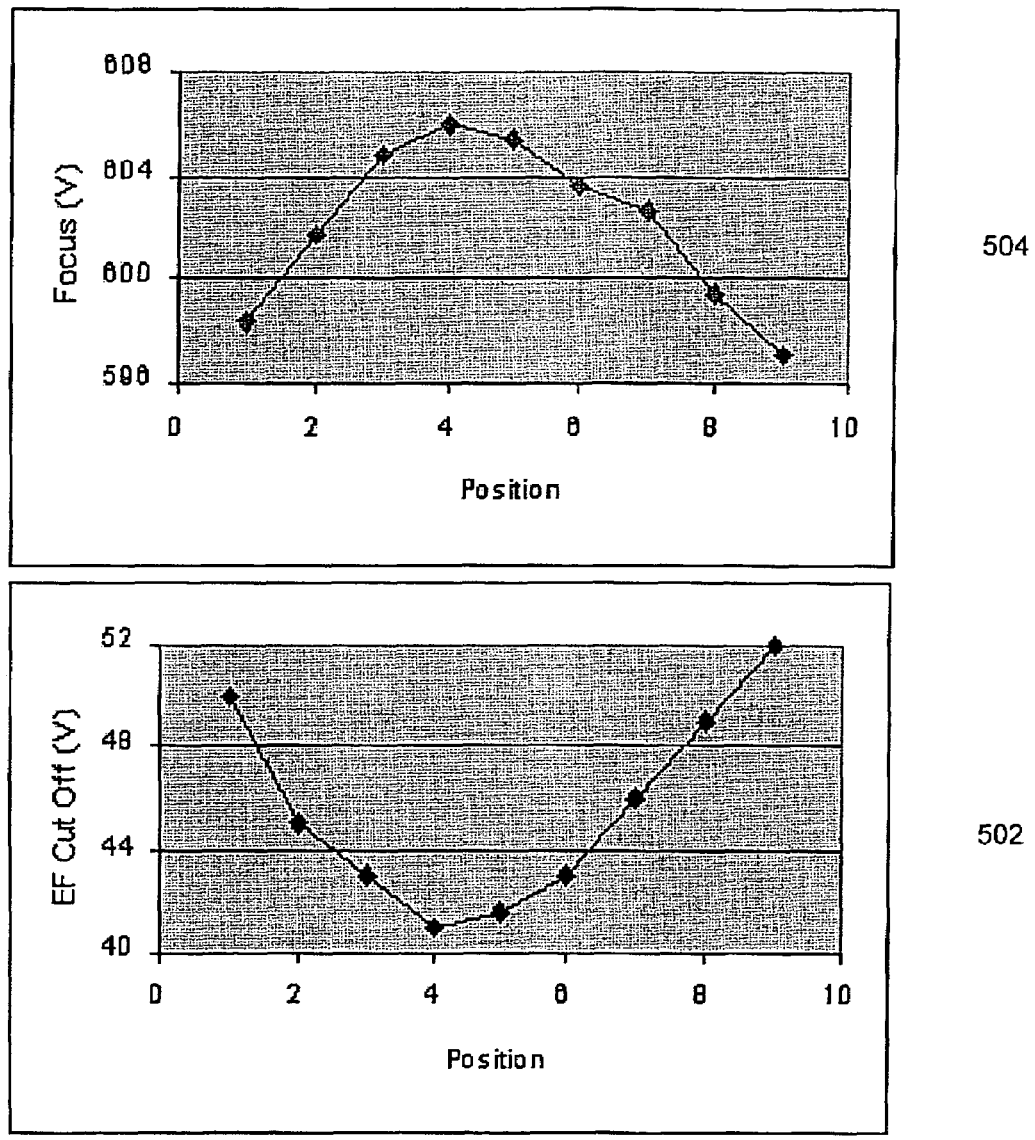
FIG. 5 includes graphs showing a close correlation between energy filter cut-off voltages and contrast focus voltages in accordance with an embodiment of the invention.

FIG. 5 includes graphs showing a close correlation between energy filter cut-off voltages and contrast focus voltages as discovered by applicants. The lower graph 502 depicts EF cut-off voltages measured at several different positions on a low-k dielectric substrate. The positions are numbered 1 through 9 on the horizontal axis of the graph, and the measured EF cut-off voltages are given on the vertical dimension of the graph. The upper graph 504 depicts stage bias voltages determined to put the electron image in focus at those same positions on the substrate. Again, the positions are labeled 1 through 9 on the horizontal axis. The stage bias voltage for focusing (in other words, the contrast focus voltage or focus voltage) at the positions are given on the vertical dimension. A comparison of the lower and upper graphs shows that there is a strong correlation between the EF cut-off voltage at a position on the substrate and the focus voltage at that same position.

While FIG. 4 shows a detection and control system in accordance with one embodiment of the invention, other embodiments may vary the specific components utilized while maintaining the primary functionality provided thereby. For example, instead of a scintillator and photomultiplier, a microchannel plate may be used in the detection system.

Figure 6:
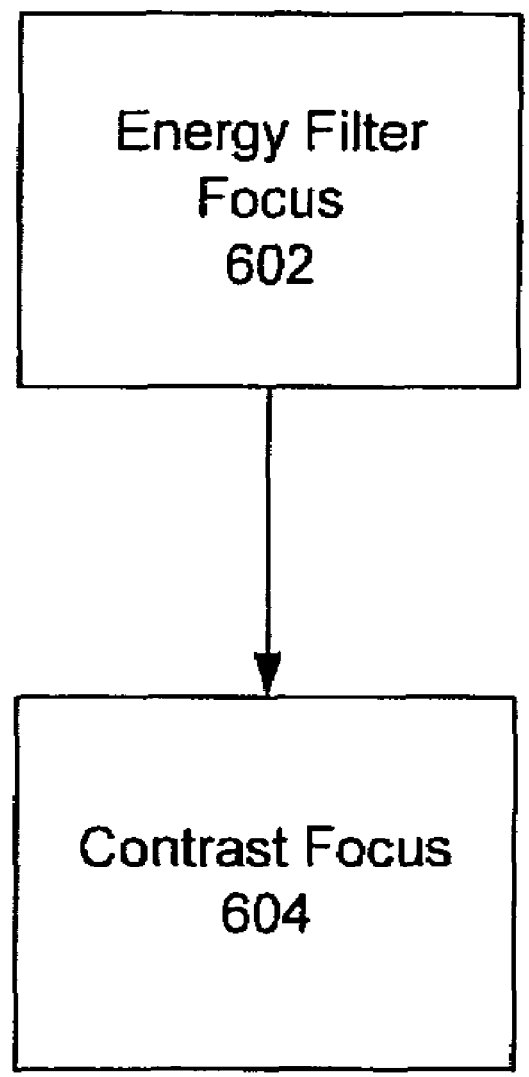
FIG. 6 is a flow chart depicting a method for automated focusing that combines energy filter focusing and contrast focusing in accordance with an embodiment of the invention

FIG. 6 is a flow chart depicting a method for automated focusing that combines energy filter focusing and contrast focusing in accordance with an embodiment of the invention. In accordance with this method, an energy filter focusing method 602, such as that discussed above in relation to FIG. 3, is first utilized. The energy filter focus 602 may be performed rapidly. For example, in one implementation, this first step may be utilized as a type of rough focus. Subsequently, a contrast focusing method 604 may be applied. The contrast focusing 604 involves obtaining and analyzing contrast information within image data to determine a focus condition. For example, in one implementation, this second step may be utilized as a type of fine focus. In other embodiments, the contrast focus step may be unnecessary because the energy filter focus step may provide sufficiently accurate and reliable focusing.

Figure 7A:
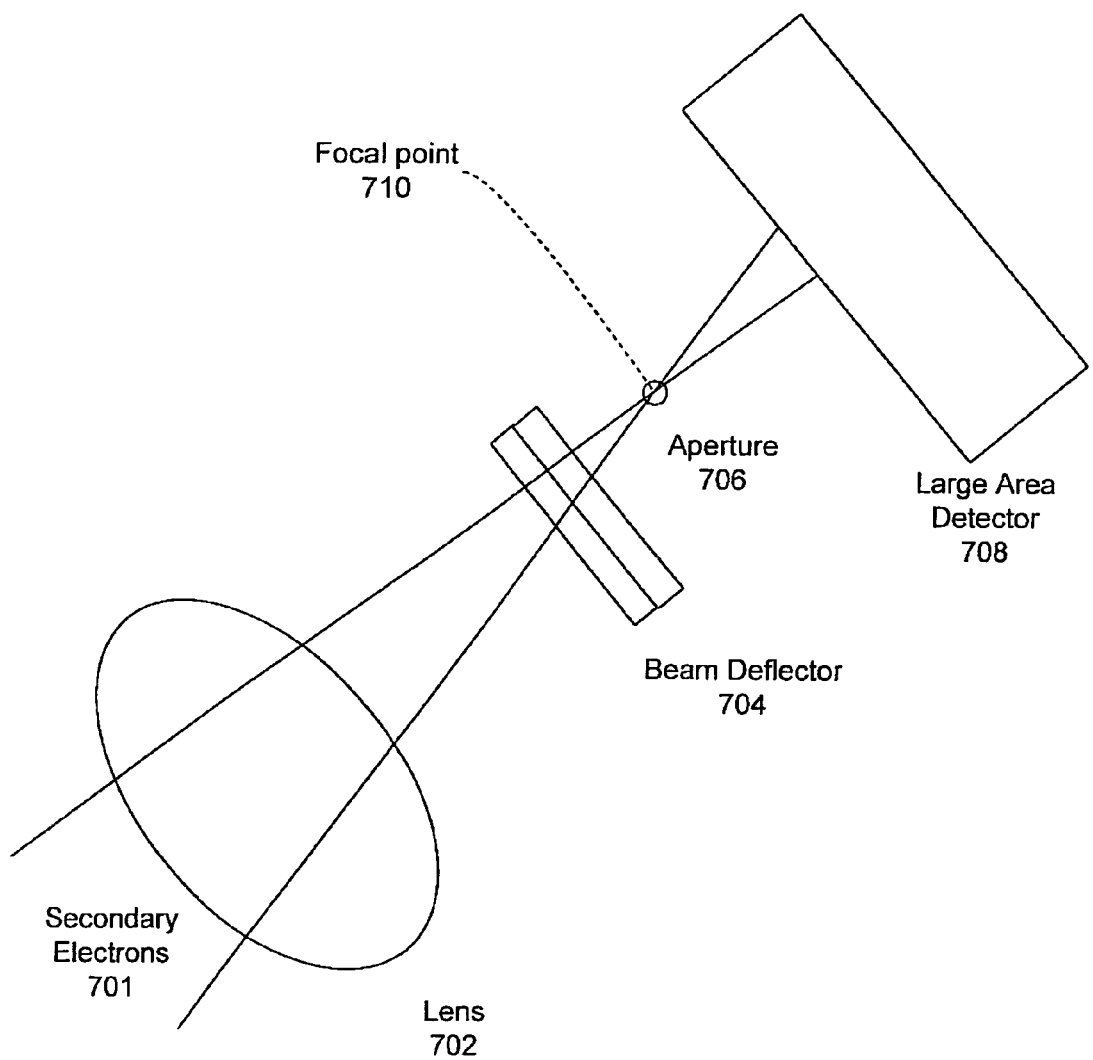
FIGS. 7A through 7C are schematic diagrams of a detection apparatus for automated focusing of an electron image in accordance with an embodiment of the invention.
Figure 7B:
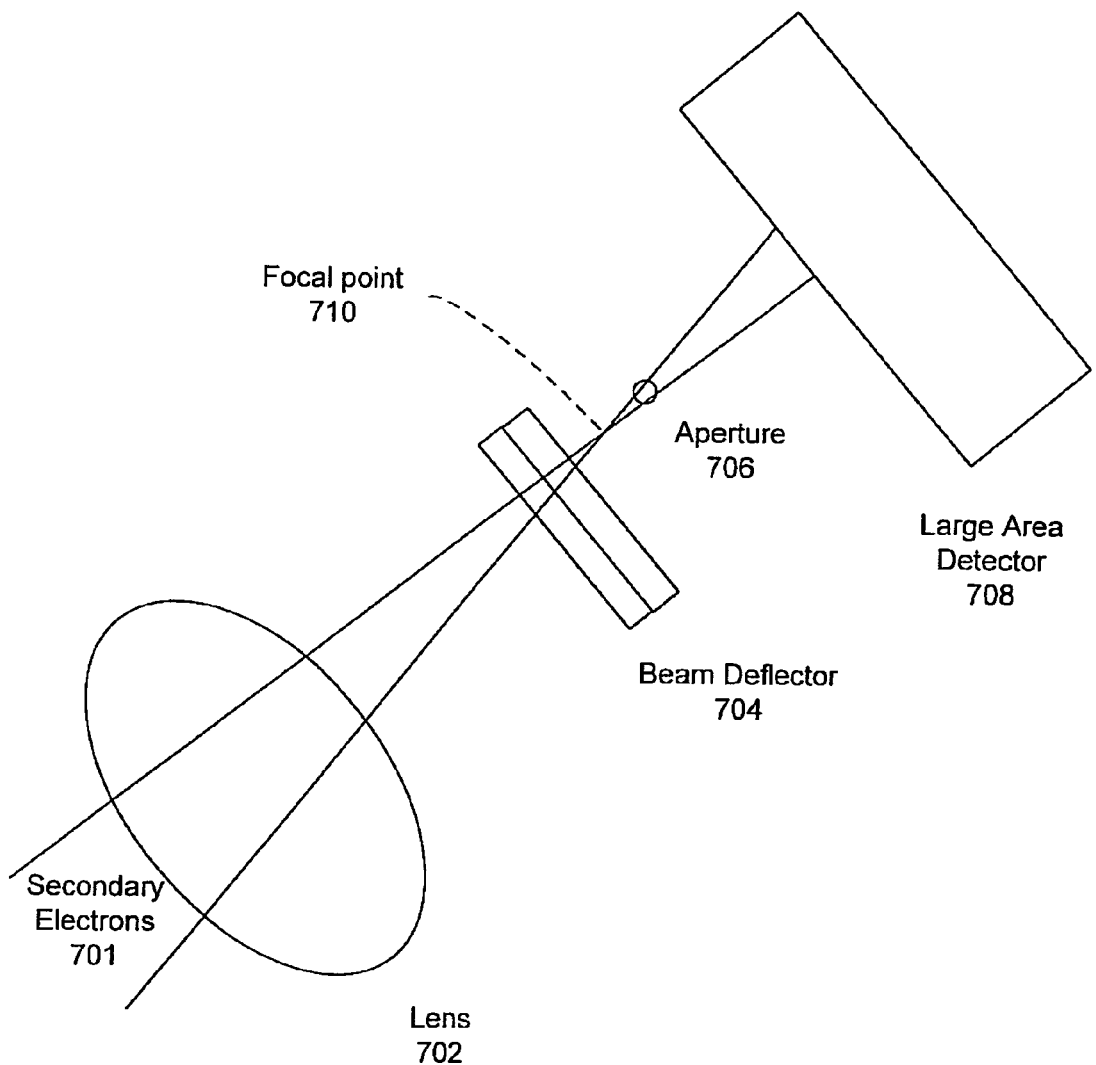
Figure 7C:
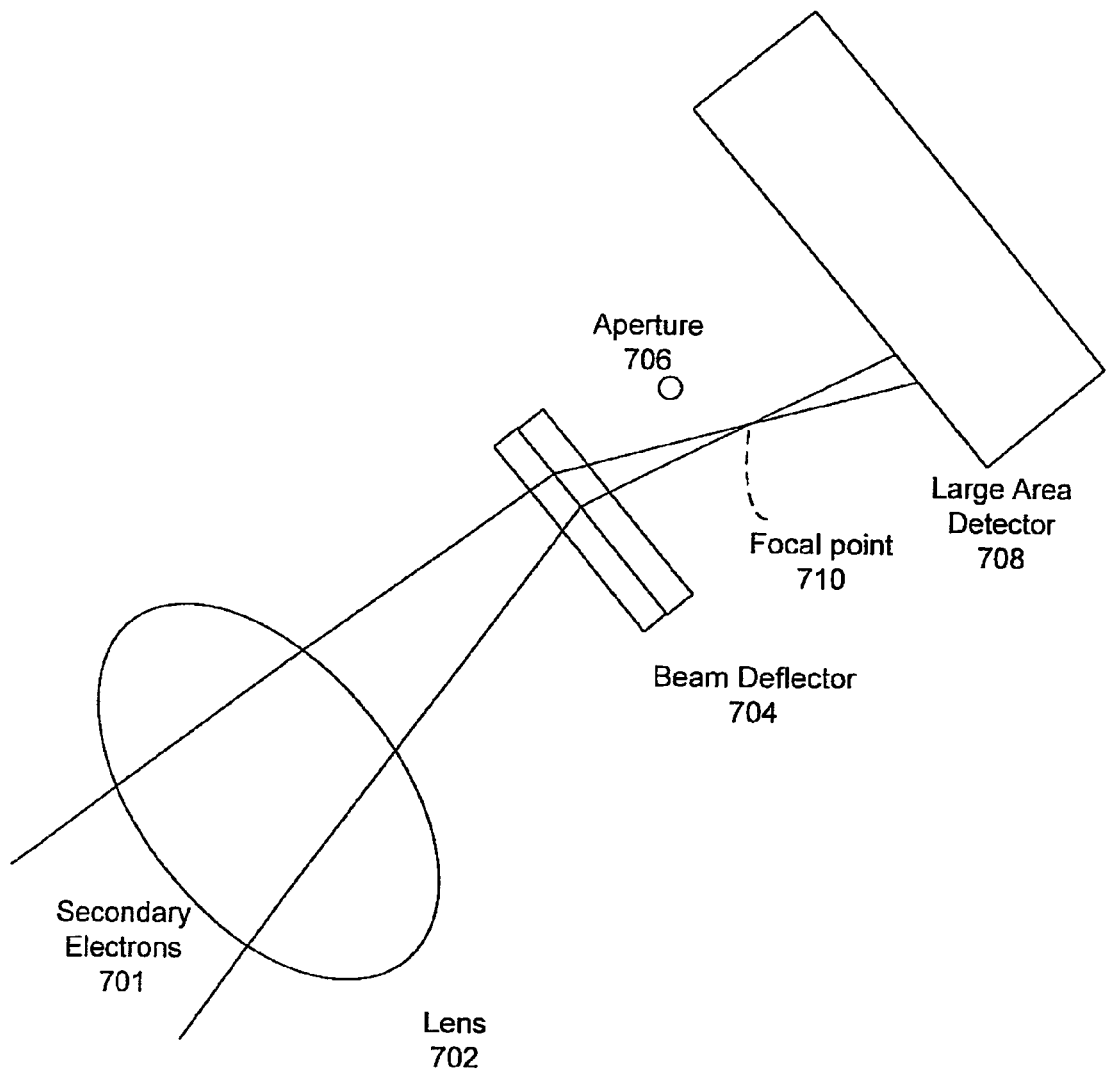

FIGS. 7A through 7C are schematic diagrams of a detection apparatus for automated focusing of an electron image in accordance with an embodiment of the invention. In one implementation, the detection apparatus may be incorporated into a scanning electron beam apparatus such as the one depicted in FIG. 1. The apparatus takes advantage of upcoming electrons in the column for purposes other than imaging. In this case, the upcoming electrons are used for focusing the primary electron beam coming down the column.

In optical microscopy, the term "confocal" typically refers to an imaging condition where at least two beams, primary and secondary, are focused at the same time at two different focal planes and image formation occurs at two different image planes. In accordance with an embodiment of the invention, a scanning electron microscope is configured such that the primary electron beam images a crossover point to a first image plane at the wafer, and the secondary electron beam images the secondary electron emission point (which may, for example, be on the order of several hundred micron is size) to a second image plane. In accordance with an embodiment of the invention, the image of the secondary electron emission point at the second image plane is used for diagnostics purposes. In particular, the image of the secondary electron emission point is used in determining a focus condition of the primary electron beam.

FIG. 7A depicts the detection apparatus in focusing mode when the primary beam is in-focus in accordance with an embodiment of the invention. In high extraction mode, after the secondary electrons 701 are deflected towards the detector, they are focused by an electron lens system 702 prior to reaching the detector. The focusing is configured such that the secondary beam comes to a focal point 710 at the second image plane. In one embodiment, the focusing may be implemented to be static. An aperture 706 is configured to be located in the second image plane and around the location of the focal point when the primary beam is in-focus. Hence, when the primary beam is in-focus per FIG. 7A, a maximal portion of the secondary electron beam is able to pass through the aperture and so a maximal intensity impinges upon the detector 708.

FIG. 7B depicts the detection apparatus in focusing mode when the primary beam is out-of-focus in accordance with an embodiment of the invention. When the primary beam is out-of-focus (whether due to working distance or surface charge variations), the focal point 710 of the secondary beam moves out of the plane of the aperture. As illustrated in FIG. 7B, the focal point 710 has moved in front of the aperture plane. Of course, depending on the focus condition of the primary beam, the focal point 710 could move either in front of or behind the aperture plane. When the focal point 710 is not in the aperture plane, then the secondary electron beam is more spread out when it hits the aperture plane. Being spread out, only a fraction of the secondary electron beam makes it through the aperture 706. Hence, a lower intensity of secondary electrons hits the detector 708.

As illustrated in FIGS. 7A and 7B, the intensity of the secondary electrons impinging the detector is indicative of the focal condition of the primary electron beam. This fact may be used in an automated focusing process. The automated focusing process involves varying a focusing condition of the primary beam to maximize the detected intensity of secondary electrons. As discussed above, the maximal detected intensity corresponds to the in-focus condition for the primary electron beam. The focusing condition of the primary beam may be varied by changing the objective lens current or voltage, or the wafer bias voltage. The process is advantageously fast and reliable.

In the focusing mode depicted in FIGS. 7A and 7B, scanning of the primary beam is turned off, and the deflector 704 for the secondary beam is turned off. In the imaging mode depicted in FIG. 7C, the primary beam is scanned, and the deflector 704 for the secondary beam is turned on. With the beam deflector 704 on, the secondary electron beam is deflected away from the aperture 706 such that the aperture 706 no longer blocks the secondary electron beam. In other words, the aperture 706 is circumvented in the normal imaging mode. The detector 708 is shown as a large area detector such that it detects the secondary electron beam in either focusing or imaging mode. In another embodiment, two separate detectors may be used instead of a single large detector. In an alternate configuration to that illustrated in FIGS. 7A-7C, the aperture may be repositioned such that the focusing mode involves turning the deflector on and the imaging mode involves turning the deflector off.

Another embodiment may utilize a target grid or other similar target placed at the secondary beam focal point. In this embodiment, a change in primary beam focus results in rotation of an image of the target grid or other similar target.

Additional value may also be derived using the secondary optics comprising the lens 702 and deflector 704. The deflector 704 may be controlled and coordinated with the scanning of the primary beam so as to de-scan or un-scan the upcoming beam to make it suitable for upper detector dark-field imaging and spectroscopic applications. For example, the un-scanned secondary beam may be focused onto the entrance of an electron spectrometer.

Figure 8:
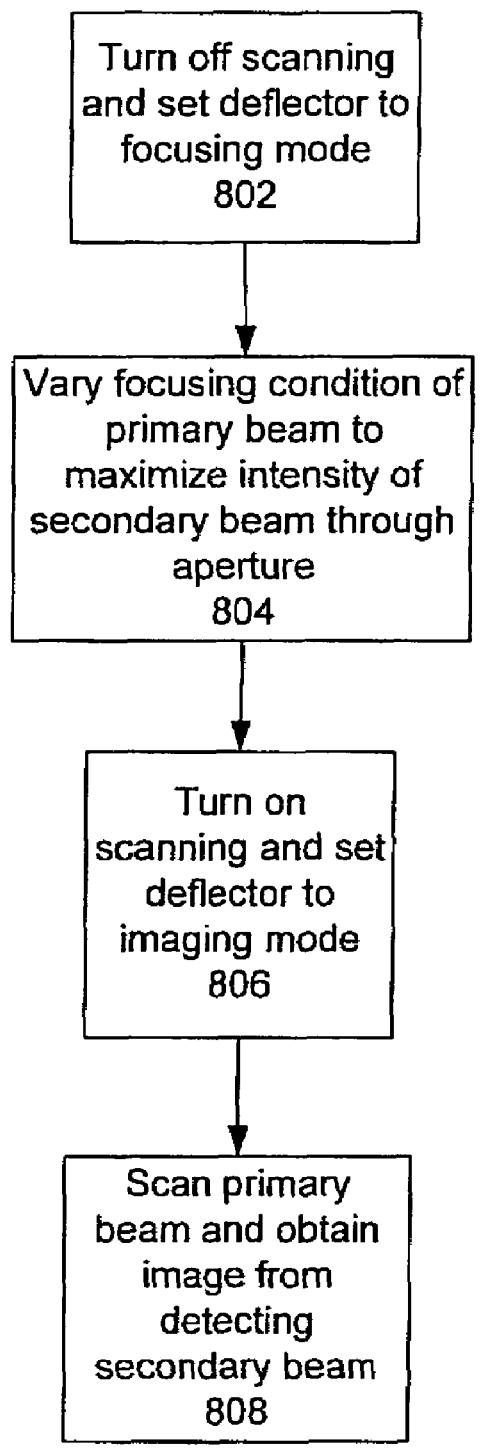
FIG. 8 is a flow chart depicting a method for automated focusing of an electron image using the detection apparatus in accordance with an embodiment of the invention.

FIG. 8 is a flow chart depicting a method for automated focusing of an electron image using the detection apparatus in accordance with an embodiment of the invention. Primary scanning is turned off and the secondary beam deflector is set 802 such that the apparatus is in the focusing mode. In focusing mode, the focusing condition of the primary beam is varied 804 so as to maximize the intensity that is detected through the aperture. The focusing condition of the primary beam may be varied by changing the objective lens current or voltage, or the wafer bias voltage. With the detected intensity maximized, the primary beam should be in-focus. Then, primary beam scanning is turned on and the secondary beam deflection is set 806 such that the apparatus is in the imaging mode. Thereafter, the area is scanned by the primary beam, and an in-focus electron image is obtained from detecting the secondary beam 808.

Figure 9:
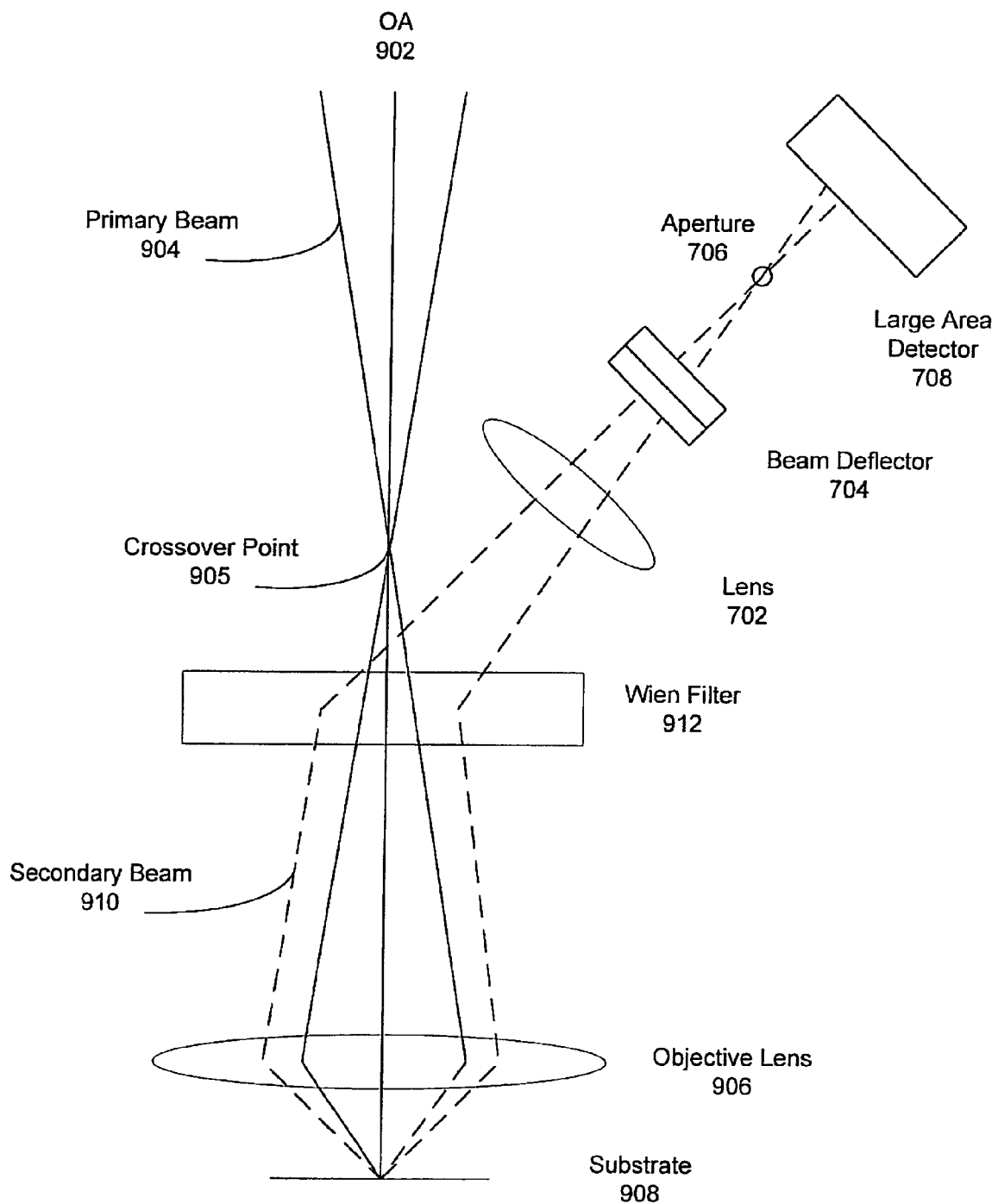
FIG. 9 is a schematic diagram illustrating an intensity-based confocal arrangement of an apparatus in accordance with an embodiment of the invention.

FIG. 9 is a schematic diagram illustrating an intensity-based confocal arrangement of an apparatus in accordance with an embodiment of the invention. The apparatus includes an electron source (not shown) that sends a primary electron beam 904 down the optical axis 902 of the column. After forming a crossover point 905, the primary beam 904 is focused by an objective lens 906 onto a spot on the surface of the substrate 908. For example, the substrate 908 may comprise a semiconductor wafer or other substrate. Impingement of the primary electrons on the substrate causes emission of secondary electrons therefrom. The secondary electron beam 910 travels back upwards through the column, wherein a Wien filter 912 deflects the beam towards the detector configuration from FIGS. 7A-7C. The detector configuration from FIGS. 7A-7C is described above in relation to those figures.

The above-described diagrams are not necessarily to scale and are intended be illustrative and not limiting to a particular implementation. The above-described invention may be used in an automatic inspection or review system and applied to the inspection or review of wafers, optical masks, X-ray masks, electron-beam-proximity masks and stencil masks and similar substrates in a production environment.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. A method for automated focusing of an electron image in a scanning electron imaging apparatus, the method comprising:

varying a focusing condition of a primary electron beam in a first image plane so as to maximize an intensity of a secondary electron beam through an aperture in a second image plane;

turning off scanning of the primary beam; and setting a deflector for the secondary beam to a focusing mode upon initiation of the automated focusing.

2. The method of claim 1, further comprising:

turning on scanning of the primary beam; and resetting the deflector to an imaging mode upon completion of the automated focusing.

3. The method of claim 2, wherein in the imaging mode the secondary beam is deflected so as to circumvent the aperture but still be detected.

4. The method of claim 1, wherein the focusing condition comprises a wafer bias voltage.

5. The method of claim 1, wherein the focusing condition comprises an objective lens focusing strength.

6. The method of claim 1, wherein the focusing condition comprises an extraction field strength.

7. The method of claim 1, wherein the focusing condition comprises a source voltage level.

* * * * *